(12) United States Patent
Besser

(10) Patent No.: US 7,719,035 B2
(45) Date of Patent: May 18, 2010

(54) LOW CONTACT RESISTANCE CMOS CIRCUITS AND METHODS FOR THEIR FABRICATION

(75) Inventor: Paul R. Besser, Sunnyvale, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/144,399

(22) Filed: Jun. 23, 2008

(65) Prior Publication Data

US 2008/0251855 A1    Oct. 16, 2008

Related U.S. Application Data

(62) Division of application No. 11/424,373, filed on Jun. 15, 2006, now Pat. No. 7,405,112.

(51) Int. Cl.
*H01L 29/745* (2006.01)
*H01L 21/8238* (2006.01)
*H01L 21/4763* (2006.01)

(52) U.S. Cl. .................. 257/213; 257/274; 257/757; 257/E21.438; 257/E21.439; 438/199; 438/649; 438/651; 438/682

(58) Field of Classification Search .............. 438/199, 438/648–653, 655, 656, 682, 683; 257/E21.164, 257/E21.438, E21.439, 213, 229, 274, 338, 257/369, 757, 769

See application file for complete search history.

(56) References Cited

U.S. PATENT DOCUMENTS

| 6,746,909 B2 * | 6/2004 | Nishiyama ............... 438/230 |
| 7,158,401 B2 | 1/2007 | Bhattacharyya |
| 2003/0148563 A1 | 8/2003 | Nishiyama |
| 2004/0142567 A1 | 7/2004 | Nakajima et al. |
| 2005/0167762 A1 | 8/2005 | Kadoshima et al. |
| 2005/0221612 A1 | 10/2005 | Brown et al. |
| 2006/0017110 A1 | 1/2006 | Adetutu et al. |

FOREIGN PATENT DOCUMENTS

| JP | 2000349169 | 12/2000 |
| JP | 2002009015 | 1/2002 |

OTHER PUBLICATIONS

International Search Report for International Application No. PCT/US2007/007549, mailed Aug. 22, 2007, 3 pages.

\* cited by examiner

*Primary Examiner*—Hsien-ming Lee
(74) *Attorney, Agent, or Firm*—Ingrassia Fisher & Lorenz, P.C.

(57) ABSTRACT

A low contact resistance CMOS integrated circuit and method for its fabrication are provided. The CMOS integrated circuit comprises a first transition metal electrically coupled to the N-type circuit regions and a second transition metal different than the first transition metal electrically coupled to the P-type circuit regions. A conductive barrier layer overlies each of the first transition metal and the second transition metal and a plug metal overlies the conductive barrier layer.

14 Claims, 4 Drawing Sheets

LOW CONTACT RESISTANCE CMOS CIRCUITS AND METHODS FOR THEIR FABRICATION

CROSS-REFERENCE TO RELATED APPLICATION

This application is a divisional of U.S. patent application Ser. No. 11/424,373, filed on Jun. 15, 2006.

TECHNICAL FIELD

The present invention generally relates CMOS integrated circuits and to methods for their fabrication, and more specifically to low contact resistance CMOS circuits and to methods for their fabrication.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS integrated circuit (IC). There is a continuing trend to incorporate more and more circuitry on a single IC chip. To incorporate the increasing amount of circuitry the size of each individual device in the circuit and the size and spacing between device elements (the feature size) must decrease. The individual elements of the circuits, MOS transistors and other passive and active circuit elements, must be interconnected by metal or other conductors to implement the desired circuit function. Some small resistance is associated with each contact between the conductor and the circuit element. As the feature size decreases, the contact resistance increases and becomes a greater and greater percentage of the total circuit resistance. As feature sizes decrease from 150 nanometer (nm) to 90 nm, then to 45 nm and below the contact resistance becomes more and more important. At feature sizes of 32 nm the contact resistance likely will dominate chip performance unless some innovation changes the present trend.

Accordingly, it is desirable to provide low contact resistance CMOS integrated circuits. In addition, it is desirable to provide methods for fabricating low contact resistance CMOS integrated circuits. Furthermore, other desirable features and characteristics of the present invention will become apparent from the subsequent detailed description and the appended claims, taken in conjunction with the accompanying drawings and the foregoing technical field and background.

BRIEF SUMMARY

A low contact resistance CMOS integrated circuit is provided. In accordance with one embodiment the CMOS integrated circuit comprises a first transition metal electrically coupled to the N-type circuit regions and a second transition metal different than the first transition metal electrically coupled to the P-type circuit regions. A conductive barrier layer overlies each of the first transition metal and the second transition metal and a plug metal overlies the conductive barrier layer.

Methods are provided for fabricating a low contact resistance CMOS integrated circuit having N-type drain regions and P-type drain regions. In accordance with one embodiment the method comprises forming a high barrier height metal silicide in contact with the P-type drain regions and a low barrier height metal silicide in contact with the N-type drain regions. A dielectric layer is deposited and patterned to form first openings exposing a portion of the high barrier height metal silicide and second openings exposing a portion of the low barrier height metal silicide. A low barrier height metal is deposited into the second openings to contact the portion of the low barrier height metal silicide and a high barrier height metal is deposited into the first openings to contact the portion of the high barrier height metal silicide. A conductive capping layer is deposited in contact with the high barrier height metal and with the low barrier height metal and the first and second openings are filled with a plug metal in contact with the conductive capping layer.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
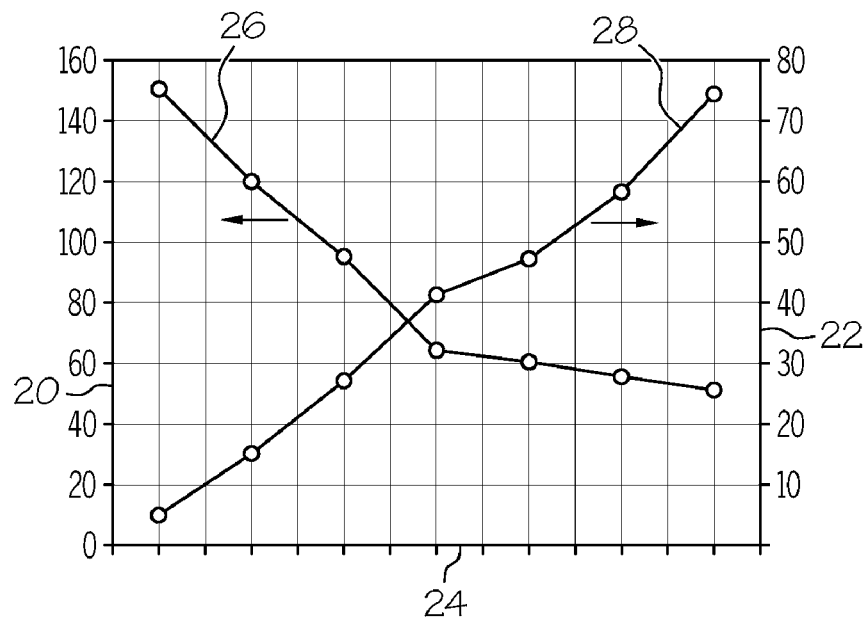
FIG. 1 illustrates graphically the problem of contact resistance as feature size decreases.

FIG. 1 illustrates graphically the problem of contact resistance as feature size decreases. Left vertical axis 20 indicates feature size in nanometers. Right vertical axis 22 indicates contact resistance as measured in Ohms. Horizontal axis 24 indicates "technology node." "Technology node" indicates the technology package that accompanies a particular feature size. Typically a complete technology package accompanies each reduction in feature size. A device that is fabricated at, for example, the "90 nm technology node" will have a minimum feature size of 90 nm and will be fabricated by a process recipe specifically designed for devices of that size. Curve 26 indicates the progression of feature sizes as the industry moves from technology node to technology node. Curve 28 indicates the typical contact resistance observed at each of those technology nodes. As can be readily seen, as the feature size decreases the contact resistance increases markedly. The speed at which a circuit can operate is governed in large part by resistances encountered in the circuit, and as feature size decreases the contact resistance is becoming more and more important in limiting that operating speed.

Figure 2:
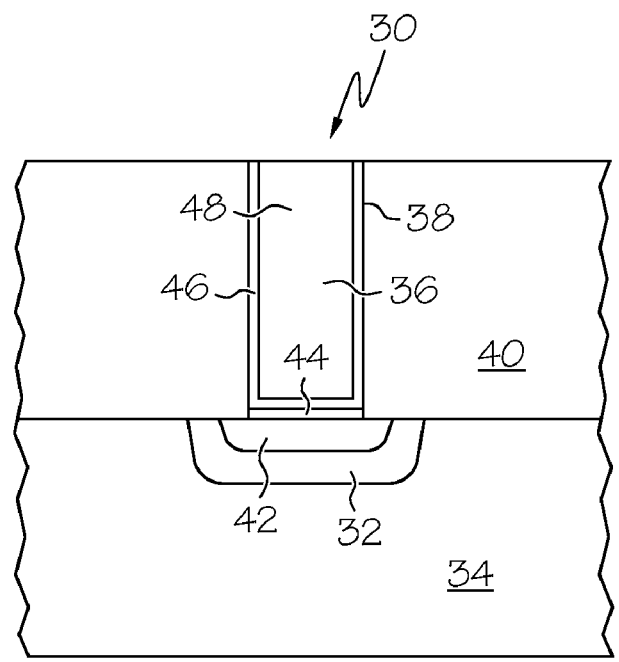
FIG. 2 schematically illustrates a conductive contact to an impurity doped region.

FIG. 2 schematically illustrates, in cross section, a contact 30 between an impurity doped region 32 in a silicon substrate 34 and a conductive metal plug 36. Although not illustrated, the conductive metal plug would, in turn, be contacted by metallization used to interconnect devices of the integrated circuit (IC) to implement the intended circuit function. Contact 30 is formed in an opening or via 38 that has been etched through a dielectric layer 40. A metal silicide layer 42 is formed at the surface of impurity doped region 32. At least of portion of the metal silicide layer is exposed at the bottom of via 38. An interface or contacting layer 44 is formed in contact with the metal silicide layer, a barrier layer 46 contacts the layer 44 and extends upwardly along the walls of the via, and a conductive material 48 is deposited over the barrier layer to fill the contact. In prior art structures the conductive plug structure included a titanium (Ti) contacting layer in contact with the silicide layer, a titanium nitride (TiN) layer overlying the titanium layer and tungsten (W) contacting the TiN layer and filling the via.

The total contact resistance $R_T$ of contact 30 is the sum of several resistances: silicide 42 to silicon 32 interface resistance $R_1$, the resistance $R_2$ of silicide 42 itself, silicide 42 to interface metal 44 interface resistance $R_3$, the resistance $R_4$ of interface metal 44 and barrier layer 46, and the resistance $R_5$ made up of the resistance in parallel of barrier layer 46 and conductive plug material 48. Thus $R_T = R_1 + R_2 + R_3 + R_4 + R_5$. Various embodiments of the invention act to reduce the total contact resistance $R_T$ by optimizing $R_1$ and $R_2$ and by reducing $R_3$, $R_4$, and $R_5$. Total contact resistance is reduced by the proper selection of silicide, interface metal, barrier layer material, and conductive plug material.

FIGS. 3-10 schematically illustrate, in cross section, method steps for the fabrication of a CMOS integrated circuit 50 in accordance with various embodiments of the invention. Various steps in the manufacture of MOS components are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 3:
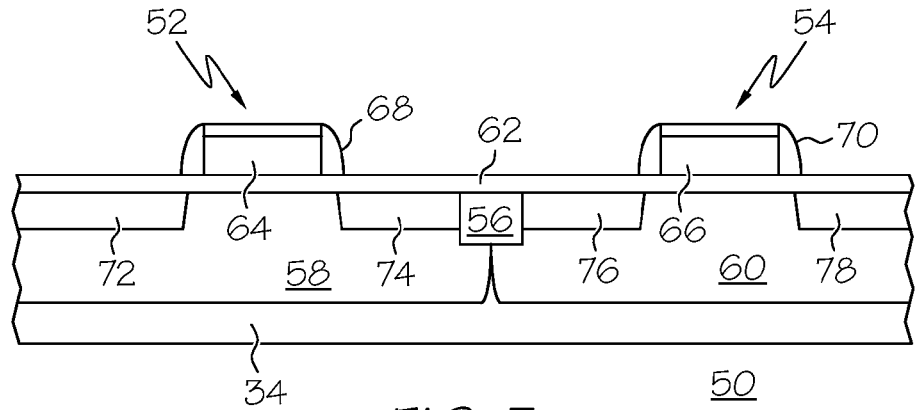
FIGS. 3-10 schematically illustrate, in cross section, method steps for the fabrication of a CMOS integrated circuit in accordance with various embodiments of the invention.

CMOS IC 50 includes a plurality of N-channel MOS transistors 52 and P-channel MOS transistors 54, only one each of which are illustrated. Those of skill in the art will appreciate that IC 50 may include a large number of such transistors as required to implement the desired circuit function. The initial steps in the fabrication of IC 50 are conventional so the structure resulting from these steps is illustrated in FIG. 3, but the initial steps themselves are not shown. The IC is fabricated on a silicon substrate 34 which can be either a bulk silicon wafer as illustrated or a thin silicon layer on an insulating substrate (SOI). As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. N-channel MOS transistor 52 and P-channel MOS transistor 54 are electrically isolated by a dielectric isolation region 56, preferably a shallow trench isolation (STI) region. As is well known, there are many processes that can be used to form the STI, so the process need not be described here in detail. In general, STI includes a shallow trench that is etched into the surface of the semiconductor substrate and that is subsequently filled with an insulating material. After the trench is filled with an insulating material such as silicon oxide, the surface is usually planarized, for example by chemical mechanical planarization (CMP).

At least a surface portion 58 of the silicon substrate is doped with P-type conductivity determining impurities for the fabrication of N-channel MOS transistor 52 and another surface portion 60 is doped with N-type conductivity determining impurities for the fabrication of P-channel MOS transistors 54. Portions 58 and 60 can be impurity doped, for example, by the implantation and subsequent thermal annealing of dopant ions such as boron and arsenic.

In the conventional processing a layer of gate insulating material 62 is formed at the surface of the impurity doped regions and gate electrodes 64 and 66 are formed overlying the gate insulating material and impurity doped regions 58 and 60, respectively. The layer of gate insulating material can be a layer of thermally grown silicon dioxide or, alternatively (as illustrated), a deposited insulator such as a silicon oxide, silicon nitride, a high dielectric constant insulator such as HfSiO, or the like. Deposited insulators can be deposited, for example, by chemical vapor deposition (CVD), low pressure chemical vapor deposition (LPCVD), or plasma enhanced chemical vapor deposition (PECVD). Gate insulator 62 preferably has a thickness of about 1-10 nm although the actual thickness can be determined based on the application of the transistor in the circuit being implemented. Gate electrodes 64 and 66 are preferably formed by depositing, patterning, and etching a layer of polycrystalline silicon, preferably a layer of undoped polycrystalline silicon. The gate electrodes generally have a thickness of about 100-300 nm. The polycrystalline silicon can be deposited, for example, by the reduction of silane in a CVD reaction. Sidewall spacers 68 and 70 are formed on the sidewalls of gate electrodes 64 and 66, respectively. The sidewall spacers are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a $CHF_3$, $CF_4$, or $SF_6$ chemistry. A layer of masking material, which can be, for example, a layer of photoresist is applied and patterned to expose one of the transistor structures. The masking material is patterned, for example to mask the P-channel MOS transistor structure and to expose the N-channel MOS transistor structure. Using the patterned masking material as an ion implantation mask, N-type conductivity determining ions are implanted into P-type portion 58 of the silicon substrate to form N-type source 72 and drain 74 regions in the silicon substrate and into gate electrode 64 to conductivity dope that gate electrode with N-type impurities. The implanted ions can be either phosphorus or arsenic ions. The patterned layer of masking material is removed and another layer of masking material, again a layer such as a layer of photoresist, is applied and is patterned to expose the other of the transistor structures. Using this second layer of patterned mask material as an ion implantation mask P-type conductivity determining ions such as boron ions are implanted into N-type portion 60 of the silicon substrate to form P-type source 76 and drain 78 regions in the silicon substrate and into gate electrode 66 to conductivity dope that gate electrode with P-type impurities. For each of the transistor structures the ion implanted source and drain regions are self aligned with the gate electrodes. As those of skill in the art will appreciate, additional sidewall spacers and additional implantations may be employed to create drain extensions, halo implants, deep source and drains, and the like. It will also be appreciated by those skilled in the art that the order of forming the source and drain regions of the N-channel and the P-channel MOS transistors can be reversed.

Figure 4:
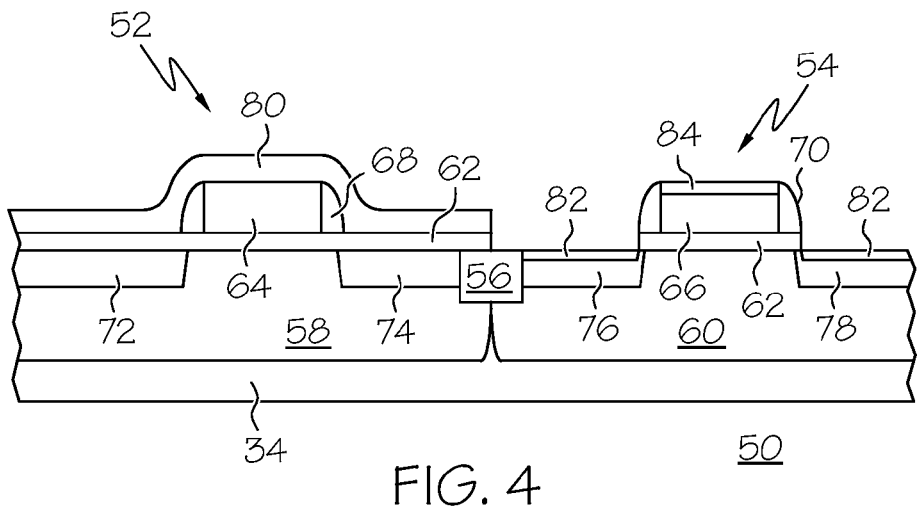

In accordance with an embodiment of the invention a layer of masking material 80, such as a layer of low temperature silicon nitride, is deposited and patterned as illustrated in FIG. 4. The layer of masking material is patterned to leave the material masking N-channel MOS transistor 52 and exposing P-channel MOS transistor 54. The patterned mask is used as an etch mask and any exposed portion of gate insulator 62 is etched to expose portions of P-type source 76 and drain 78 regions. The etching step is also used to remove any insulative material that may remain on gate electrode 66. In accordance with an embodiment of the invention a layer (not illustrated) of high barrier height silicide forming metal is deposited over the structure and in contact with the exposed portion of P-type source 76 and drain 78 regions and gate electrode 66. By "high barrier height silicide forming metal" is meant a metal having a barrier height with respect to silicon of greater than at least about 0.7 eV. Silicide forming metals that meet this criterion include, for example, iridium and platinum. In accordance with one embodiment of the invention the structure with the silicide forming metal is heated, for example by rapid thermal annealing (RTA) to cause the silicide forming metal to react with exposed silicon to form a metal silicide 82 at the surface of the P-type source 76 and drain 78 regions and a metal silicide 84 on P-type gate electrode 66. The silicide forms only in those areas where there is exposed silicon. Silicide does not form, and the silicide forming metal remains unreacted in those areas where there is no exposed silicon such as on the sidewall spacers, the exposed STI, and on the masking layer. The unreacted silicide forming metal can be removed by wet etching in a $H_2O_2/H_2SO_4$ or $HNO_3/HCl$ solution. The silicide formed from the selected silicide forming metals forms a Shottky contact to the P-type silicon having a low contact resistance to the P-type doped source and drain regions and to the P-type doped gate electrode.

Figure 5:
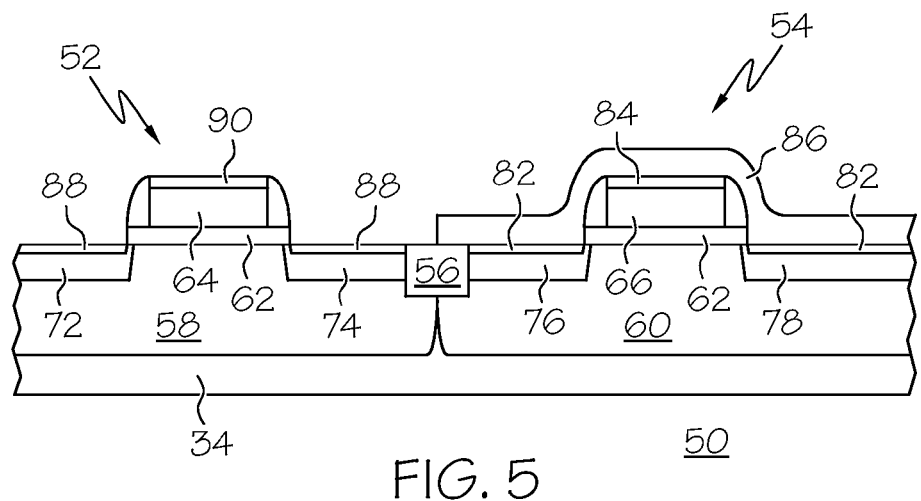

The patterned layer of masking material 80 is removed and another layer of masking material 86 is deposited and patterned as illustrated in FIG. 5. The layer of masking material can be, for example a deposited layer of low temperature nitride. The layer of masking material is patterned to expose N-channel MOS transistor 52 and to leave covered P-channel MOS transistor 54. The patterned mask is used as an etch mask and any exposed portion of gate insulator 62 is etched to expose portions of N-type source 72 and drain 74 regions. The etching step is also used to remove any insulative material that may remain on gate electrode 64. In accordance with an embodiment of the invention a layer (not illustrated) of low barrier height silicide forming metal is deposited over the structure and in contact with the exposed portion of N-type source 72 and drain 74 regions and gate electrode 64. By "low barrier height silicide forming metal" is meant a metal having a barrier height with respect to silicon of less than about 0.4 eV and preferably less than about 0.3 eV. Silicide forming metals that meet this criterion include, for example, ytterbium, erbium, dysprosium, and gadolinium. In accordance with one embodiment of the invention the structure with the silicide forming metal is heated, for example by RTA to cause the silicide forming metal to react with exposed silicon to form a metal silicide 88 at the surface of the N-type source 72 and drain 74 regions and a metal silicide 90 on N-type gate electrode 64. Again, the silicide forms only in those areas where there is exposed silicon. Silicide does not form, and the silicide forming metal remains unreacted in those areas where there is no exposed silicon such as on the sidewall spacers, the exposed STI, and on the masking layer. The unreacted silicide forming metal can be removed by wet etching in a $H_2O_2/H_2SO_4$ or $HNO_3HCl$ solution. The silicide formed from the selected silicide forming metals form a Shottky contact to the N-type silicon having a low contact resistance to the N-type doped source and drain regions and to the N-type doped gate electrode. Metal silicide regions 82, 84, 88, and 90 are also characterized by having low resistance. The silicide forming metals thus optimize and reduce the interface resistance $R_1$ and the resistance of the silicide itself, $R_2$. Although not illustrated, the order in which the silicide regions are formed can be reversed such that silicide regions 88 and 90 are formed before silicide regions 82 and 84. In each step the silicide forming metals can be deposited, for example by sputtering, to a thickness of about 5-50 nm and preferably to a thickness of about 10 nm.

Figure 6:
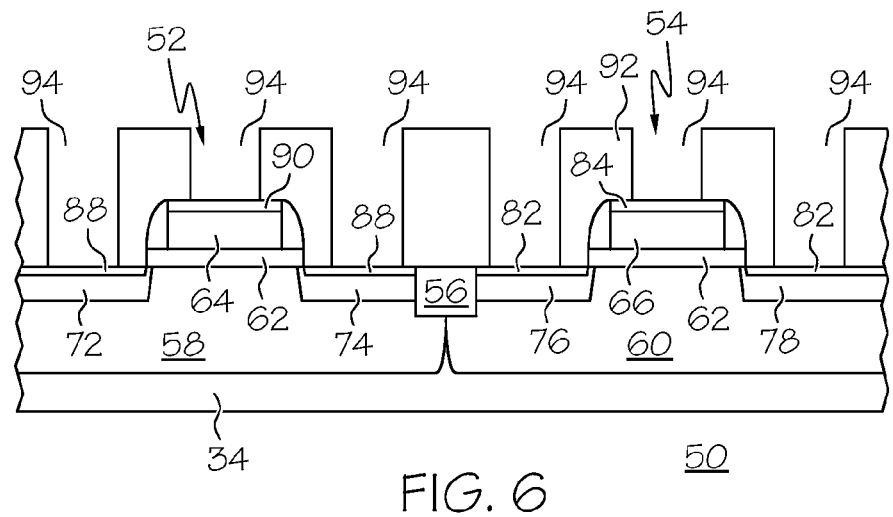

Masking layer 86 is removed and a layer 92 of dielectric material such as a layer of silicon oxide is deposited as illustrated in FIG. 6. The top surface of layer 92 is planarized, for example by chemical mechanical planarization (CMP) and openings or vias 94 are etched through the layer to expose portions of metal silicide regions 82, 84, 88, and 90. Layer 92 is preferably deposited by a low temperature process and may be deposited, for example by a LPCVD process. Although not illustrated, layer 92 may include layers of more than one dielectric material, and those layers may include, for example, an etch stop layer to facilitate the etching of the vias. In this illustrative embodiment vias are shown that expose portions of the metal silicide on gate electrodes 64 and 66. Depending on the circuit being implemented, vias may or may not be formed to all of the gate electrodes.

Figure 7:
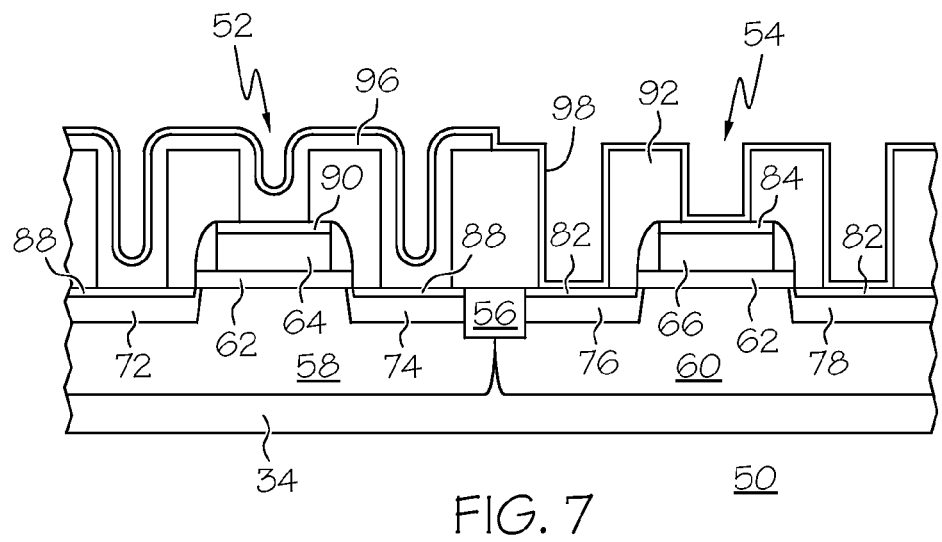

As illustrated in FIG. 7, the method continues, in accordance with one embodiment of the invention, by depositing and patterning a masking layer 96. Masking layer 96, which can be, for example, a layer of deposited low temperature nitride, is patterned to expose P-channel MOS transistor 54 and to mask N-channel MOS transistor 52. The masking layer is removed from vias 94 on the P-channel MOS transistor to expose a portion of metal silicide regions 82 and 84. A layer of transition metal 98 is deposited over the masking layer and extending into vias 94 to contact metal silicide regions 82 and 84. The layer of transition metal contacting P-doped silicon preferably has a barrier height with respect to silicon that is greater than or equal to about 0.7 eV. Suitable metals for transition metal layer 98 include, for example, palladium and platinum having barrier heights of 0.8 and 0.9 eV, respectively, and alloys of those metals. Other suitable metals are gold, silver, and aluminum and their alloys, all of which have barrier heights between 0.7 and 0.9 eV. The transition metal layer can be deposited, for example, by atomic layer deposition (ALD) or physical vapor deposition (PVD) such as by sputtering. The layer of transition metal can be thin, about 1-5 nm. All that is needed is a sufficient amount of the transition metal to effect a change in work function between the metal silicide in regions 82 and 84 and the overlying plug metallization to be subsequently formed. Some, but very little transition metal will deposit on the sidewalls of the vias.

Figure 8:
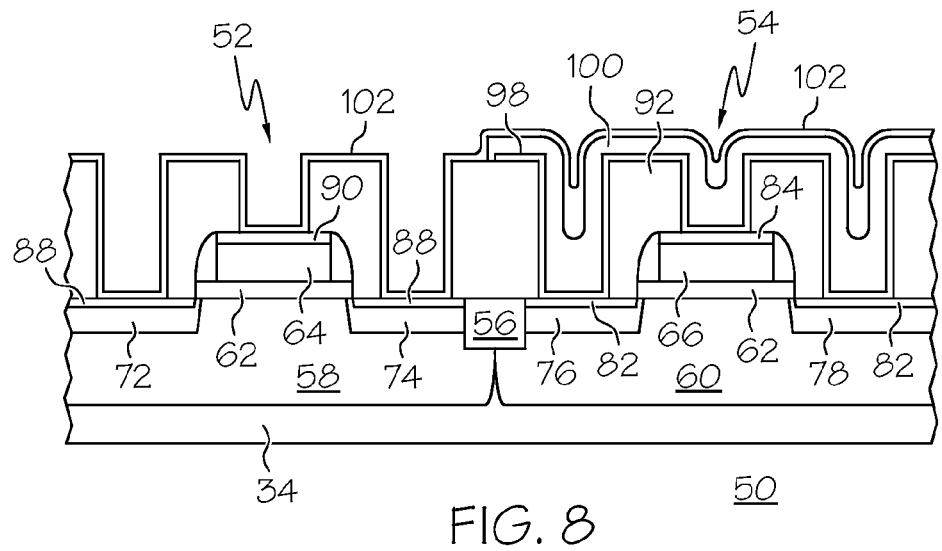

Patterned masking layer 96 and the portion of transition metal 98 that overlies the patterned masking layer are removed and another layer of masking material 100 is deposited and patterned as illustrated in FIG. 8. Masking layer 100, which again can be, for example, a layer of deposited low temperature nitride, is patterned to expose N-channel MOS transistor 52 and to mask P-channel MOS transistor 54 including layer 98 of transition metal. The masking layer is removed from vias 94 on the N-channel MOS transistor to expose a portion of metal silicide regions 88 and 90. A layer of another transition metal 102 is deposited over the masking layer and extending into vias 94 to contact metal silicide regions 88 and 90. The layer of transition metal contacting N-doped silicon preferably has a barrier height with respect to silicon that is less than or equal to about 0.4 eV. Suitable metals for transition metal layer 102 include, for example, scandium and magnesium that have barrier heights of 0.35 and 0.4 eV, respectively, and alloys of those metal. Layer of transition metal 102 can be deposited, for example, by atomic layer deposition (ALD) or physical vapor deposition (PVD)

such as by sputtering to a thickness of about 1-5 nm. All that is needed is a sufficient amount of the transition metal to effect a change in work function between the metal silicide in regions 88 and 90 and the overlying plug metallization that is subsequently to be deposited.

Figure 9:
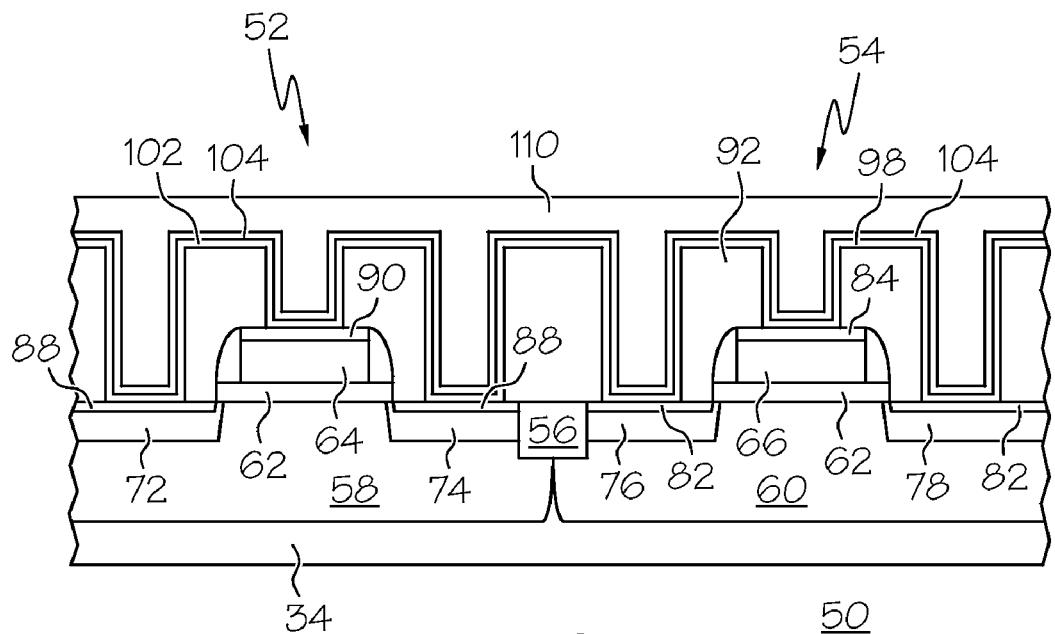

Masking layer 100 and the portion of transition metal layer 102 overlying the masking layer are removed and a conductive barrier layer 104 is deposited in contact with layer of transition metal 98 and layer of transition metal 102 as illustrated in FIG. 9. The conductive barrier layer prevents oxidation of the layers of transition metals, acts as a barrier to the migration of subsequently deposited plug materials into the surrounding dielectric layer 92, and prevents both the migration of plug material or plug material forming reactants into the underlying silicon and the migration of silicon into the plug material. Suitable materials for the conductive barrier layer include, for example titanium nitride (TiN) and tantalum nitride (TaN). The conductive barrier layer can be deposited, for example, by LPCVD, ALD, or PVD. TiN and TaN can also be formed by deposition and subsequent nitridation of titanium or tantalum, respectively. The barrier layer preferably has a thickness, as measured on the top of dielectric layer 92 of about 2-15 nm, and as measured at the bottom of vias 94 of about 1-5 nm. The thickness is preferably adjusted to minimize the resistance $R_4$ of the barrier layer while maintaining sufficient thickness to achieve the appropriate barrier qualities. As also illustrated in FIG. 9, once the barrier metal layer is deposited, the vias can be filled by depositing a layer 110 of tungsten, copper, or other conductive material to form a conductive plug. Preferably the conductive plug material is copper to reduce the resistance $R_5$. The conductive material can be deposited, for example, by PVD, ALD, CVD, or electrochemical means.

Figure 10:
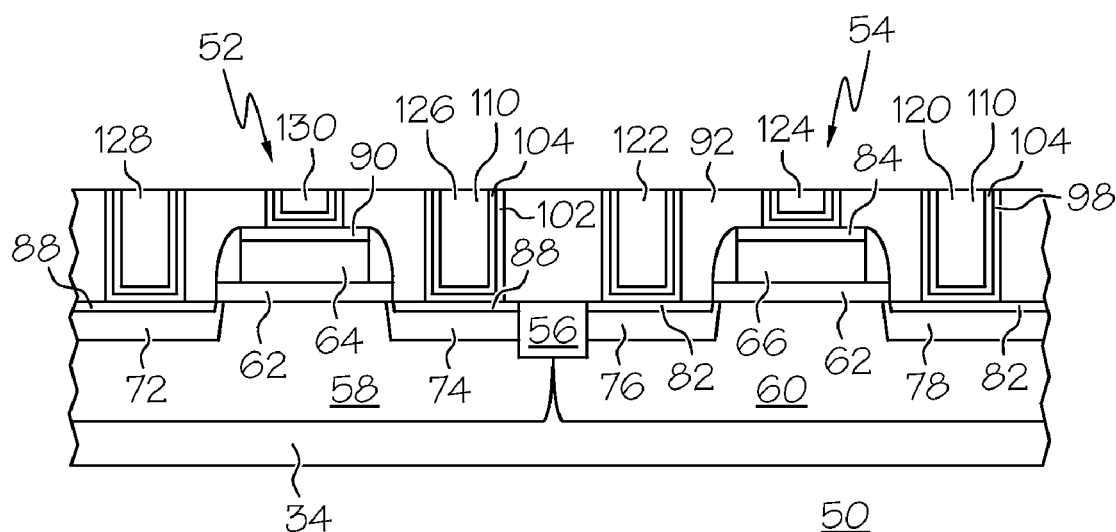

As illustrated in FIG. 10, the conductive plug structure is completed, in accordance with an embodiment of the invention, by removing the excess conductive plug material 110, conductive barrier layer 104 and transition metal layers 98 and 102 that are present on the upper surface of dielectric layer 92. The excess material can be removed, for example, by CMP. The resulting structure includes conductive plugs 120, 122, 124, 126, 128 and 130 that are in electrical contact with terminals of PMOS transistor 54 and NMOS transistor 52. Each of the conductive plugs includes conductive material 110 and conductive barrier layer 104. Conductive plugs 120, 122, and 124, respectively, are in electrical contact with a transition metal layer 98 that, in turn, is in electrical contact with metal silicide 82 contacting P-type source 76 and drain 78 regions or with metal silicide 84 contacting the gate electrode of the P-channel MOS transistor. Conductive plugs 126, 128, and 130, respectively, are in electrical contact with a transition metal layer 102 that, in turn, is in electrical contact with metal silicide 88 contacting N-type source 72 and 74 drain regions or with metal silicide 90 contacting the gate electrode of the N-channel transistor. In the resultant structure the metal barrier heights of the various conductor layers are appropriately matched to lower the overall contact resistance.

Although not illustrated in the figures, the fabrication of CMOS integrated circuit 50 would continue by the formation of interconnecting lines coupled to appropriate ones of the conductive plugs, as necessary, to connect together the N-channel and P-channel MOS transistors to implement the desired circuit function. If the interconnecting lines are formed of copper, the fabrication process might include steps of depositing and patterning dielectric layers (interlayer dielectrics or ILDs), depositing of conductive barrier layers such as layers of TaN, depositing of a layer of copper, and the polishing of the copper layer by CMP in a damascene process.

While at least one exemplary embodiment has been presented in the foregoing detailed description, it should be appreciated that a vast number of variations exist. For example, as explained above, the order of forming silicides on the N-channel and P-channel MOS transistors can be reversed. Likewise, the order of forming transition metal layers 98 and 102 can be reversed. A single annealing step can be used to react the silicide forming metal with the exposed silicon instead of the two annealing steps described. In an alternative embodiment, not illustrated in the figures, instead of depositing conductive barrier layer 104 after both transition metal layer 98 and transition metal layer 102 have been deposited, a conductive barrier layer can be deposited after each of the transition metal layers has been deposited. That is, transition metal layer 98 can be deposited and then, without breaking vacuum, the conductive barrier layer can be deposited on the transition metal layer. And then, after depositing transition metal layer 102, a conductive barrier layer can be deposited, without breaking vacuum, on that transition metal layer. By depositing the conductive barrier layer immediately after depositing the transition metal layer, the transition metal layer is better protected from oxidation. Those of skill in the art will appreciate that many cleaning steps, additional deposition steps, and the like may also be used in the inventive method. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A CMOS integrated circuit including an NMOS transistor having N-type source and drain regions and a PMOS transistor having P-type source and drain regions, the CMOS integrated circuit comprising:
   a first metal silicide contacting the N-type source and drain regions;
   a second metal silicide contacting the P-type source and drain regions, the second metal silicide having a composition different from that of the first metal silicide;
   a first transition metal contacting the first metal silicide;
   a second transition metal different in composition than the first transition metal contacting the second metal silicide;
   a first metal plug electrically contacting the first transition metal; and
   a second metal plug electrically contacting the second transition metal.

2. The CMOS integrated circuit of claim 1 wherein the first metal silicide comprises a metal silicide formed of a metal having a barrier height to silicon of less than 0.4 eV.

3. The CMOS integrated circuit of claim 2 wherein the first metal silicide comprises a metal silicide formed of a metal selected from the group consisting of ytterbium, erbium, dysprosium, and gadolinium.

4. The CMOS integrated circuit of claim 1 wherein the second metal silicide comprises a metal silicide formed of a metal having a barrier height to silicon of greater than 0.7 eV.

5. The CMOS integrated circuit of claim 4 wherein the second metal silicide comprises a metal silicide formed of a metal selected from the group consisting of iridium and platinum.

6. The CMOS integrated circuit of claim 1 wherein the first transition metal comprises a metal having a barrier height to silicon of less than or equal to about 0.4 eV.

7. The CMOS integrated circuit of claim 6 wherein the first transition metal comprises a metal selected from the group consisting of scandium and magnesium and alloys thereof.

8. The CMOS integrated circuit of claim 6 wherein the second transition metal comprises a metal having a barrier height to silicon of greater than or equal to 0.7 eV.

9. The CMOS integrated circuit of claim 8 wherein the second transition metal comprises a metal selected from the group consisting of platinum, palladium, gold, silver, aluminum and alloys thereof.

10. The CMOS integrated circuit of claim 8 wherein the first metal plug and the second metal plug comprises a metal selected from the group consisting of copper and tungsten.

11. The CMOS integrated circuit of claim 1 further comprising a conductive capping layer between the first transition metal and the first metal plug and between the second transition metal and the second metal plug.

12. A CMOS integrated circuit having a first N-type region and a second P-type region comprising:
   a first transition metal electrically coupled to the first N-type region;
   a second transition metal electrically coupled to the second P-type region, the second transition metal having a composition different from that of the first transition metal;
   a conductive barrier layer overlying each of the first transition metal and the second transition metal; and
   a plug metal overlying the conductive barrier layer.

13. The CMOS integrated circuit of claim 12 wherein the first transition metal comprises a metal selected from the group consisting of scandium and magnesium and alloys thereof.

14. The CMOS integrated circuit of claim 12 wherein the first transition metal has a first barrier height to silicon and wherein the second transition metal has a second barrier height to silicon greater than the first barrier height.

\* \* \* \* \*